(12) United States Patent  
Verlinden

(10) Patent No.: US 8,653,999 B1  
(45) Date of Patent: Feb. 18, 2014

(54) CURRENT STEERING DAC, A VIDEO ADAPTER INCLUDING A CURRENT STEERING DAC, AND A VIDEO CIRCUIT INCLUDING A CURRENT STEERING DAC

(75) Inventor: Rene Verlinden, Venlo (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/604,525

(22) Filed: Sep. 5, 2012

(51) Int. Cl.
*H03M 1/66* (2006.01)

(52) U.S. Cl.
USPC .......................................... 341/144; 341/150

(58) Field of Classification Search
USPC ......... 341/144, 150, 136, 121, 127, 153, 154; 327/313
See application file for complete search history.

(56) References Cited

U.S. PATENT DOCUMENTS

2006/0125670 A1* 6/2006 Cho et al. ...................... 341/144

* cited by examiner

*Primary Examiner* — Joseph Lauture

(57) ABSTRACT

A current steering Digital-to-Analog Converter (DAC), a video adapter including a current steering DAC, and a video circuit including a current steering DAC are described. In one embodiment, a current steering DAC includes multiple DAC unit cells that are connected in parallel with each other. Each of the DAC unit cells includes three output switches connected to a current source. The three output switches are configured to form two differential pairs of switches that are placed in parallel with each other and share a negative output switch of the three output switches. The current steering DAC also includes at least one switch control circuit configured to receive digital input data and to control the three output switches of each of the DAC unit cells to generate differential analog output data based on the digital input data and a current from the current source. Other embodiments are also described.

20 Claims, 7 Drawing Sheets

CURRENT STEERING DAC, A VIDEO ADAPTER INCLUDING A CURRENT STEERING DAC, AND A VIDEO CIRCUIT INCLUDING A CURRENT STEERING DAC

Embodiments of the invention relate generally to electronic circuits and methods for operating electronic circuits and, more particularly, to Digital-to-Analog Converters (DACs).

A DAC converts digital input data into analog output data. A conventional DAC typically includes a differential output with a signal terminal and a return path terminal. In a single-ended configuration, only the signal terminal is used. Often, the output signal of a DAC needs to be redirected to multiple output destinations. When an output signal of a conventional DAC needs to be redirected to multiple output destinations, an external switch has to be added at the output signal terminal of the conventional DAC to direct the output signal to multiple output destinations. However, an external switch that is added to an output terminal of a DAC can negatively affect the output signal of the DAC. For example, one of the key specifications for the Video Electronics Standards Association (VESA) Video Signal Standard (VSIS) is the output compliance voltage, which is dependent on the current and load resistance at an output terminal of a DAC. In practice, an external switch is often placed behind a conventional DAC to select an output path between a Video Graphics Array (VGA) connector and a docking connector. The external switch has a typical on-resistance for which the DAC must compensate. In addition, the external switch causes extra capacitance at the output terminal of the DAC, which also limits the output bandwidth of the DAC.

A current steering DAC, a video adapter including a current steering DAC, and a video circuit including a current steering DAC are described. In one embodiment, a current steering DAC includes multiple DAC unit cells that are connected in parallel with each other. Each of the DAC unit cells includes three output switches connected to a current source. The three output switches are configured to form two differential pairs of switches that are placed in parallel with each other and share a negative output switch of the three output switches. The current steering DAC also includes at least one switch control circuit configured to receive digital input data and to control the three output switches of each of the DAC unit cells to generate differential analog output data based on the digital input data and a current from the current source. Other embodiments are also described. Compared with a conventional current steering DAC, the current steering DAC does not require an external switch to redirect the output signal to multiple output destinations. Instead, each DAC unit cell of the current steering DAC includes two differential pairs of switches that are placed in parallel with each other and share a negative output switch. In this way, two positive output paths for a current are created. Because the current steering DAC can eliminate the need for an external switch, overall circuit area is saved and DAC design requirements are relaxed.

In an embodiment, a current steering DAC includes multiple DAC unit cells that are connected in parallel with each other. Each of the DAC unit cells includes a first output switch connected to a current source and a first output terminal, a second output switch connected to the current source and a second output terminal, and a third output switch connected to the current source and a third output terminal. The current steering DAC also includes at least one switch control circuit configured to receive digital input data and to control the first, second, and third output switches of each of the DAC unit cells to generate differential analog output data based on the digital input data and a current from the current source. In each of the DAC unit cells, the first, second, and third output switches are configured to form two differential pairs of switches that are placed in parallel with each other and share a negative output switch with respect to the digital input data.

In an embodiment, a video adapter includes a video processing circuit configured to generate digital input data based on video input data and a current steering DAC configured to convert the digital input data into analog data and output differential analog signals. The current steering DAC includes multiple DAC unit cells that are connected in parallel with each other. Each of the DAC unit cells includes a first output switch connected to a current source and a first output terminal, a second output switch connected to the current source and a second output terminal, and a third output switch connected to the current source and a third output terminal. The current steering DAC also includes at least one switch control circuit configured to receive the digital input data and to control the first, second, and third output switches of each of the DAC unit cells to generate differential analog output data based on the digital input data and a current from the current source. In each of the DAC unit cells, the first, second, and third output switches are configured to form two differential pairs of switches that are placed in parallel with each other and share a negative output switch with respect to the digital input data.

In an embodiment, a video circuit includes multiple VGA connectors and a current steering DAC connected to the VGA connectors. The current steering DAC includes multiple DAC unit cells that are connected in parallel with each other. Each of the DAC unit cells includes a first output switch connected to a current source and a first output terminal, a second output switch connected to the current source and a second output terminal, and a third output switch connected to the current source and a third output terminal. The current steering DAC also includes at least one switch control circuit configured to receive digital input data and to control the first, second, and third output switches of each of the DAC unit cells to generate differential analog output data based on the digital input data and a current from the current source. In each of the DAC unit cells, the first, second, and third output switches are configured to form two differential pairs of switches that are placed in parallel with each other and share a negative output switch with respect to the digital input data.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
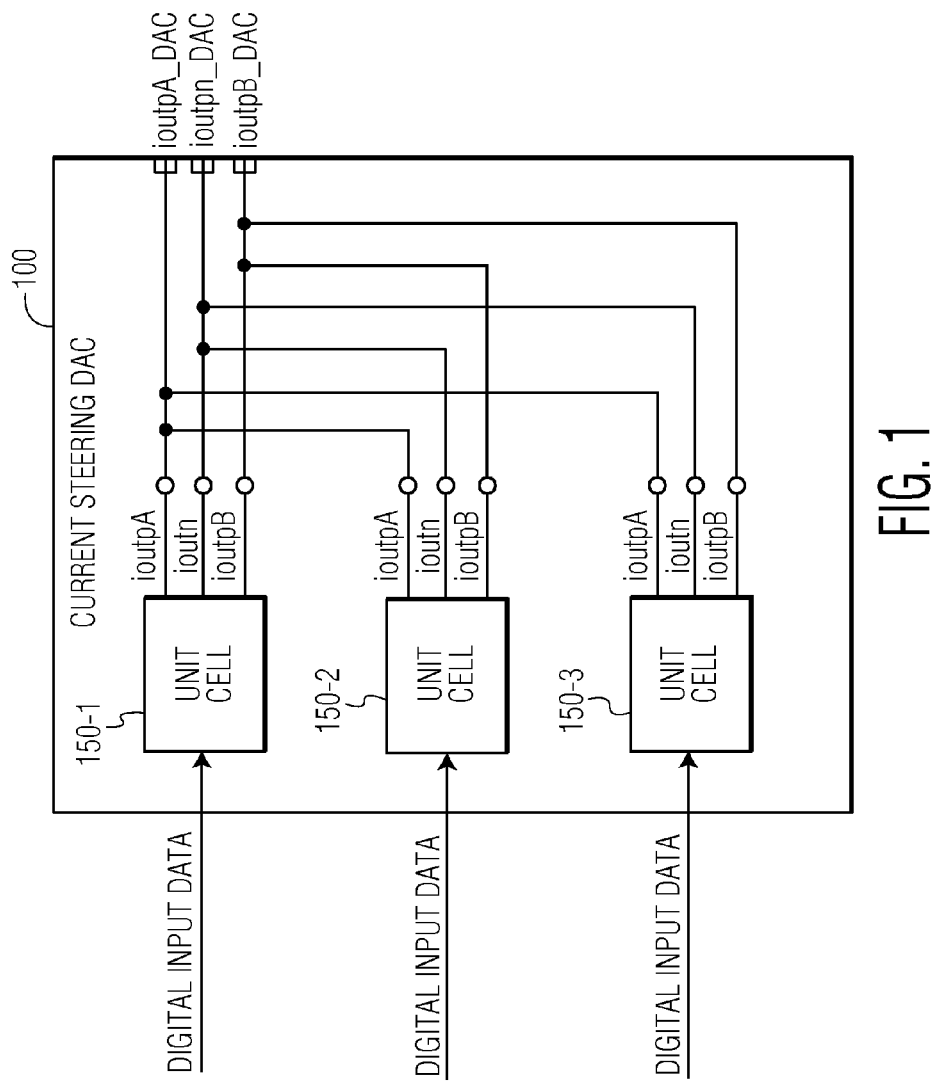
FIG. 1 is a schematic block diagram of a current steering DAC in accordance with an embodiment of the invention.

FIG. 1 is a schematic block diagram of a current steering DAC 100 in accordance with an embodiment of the invention. The current steering DAC is configured to receive digital input data and generate at least one output current based on the received digital input data. The current steering DAC may be used for various devices and applications, such as computers, industrial machineries, and appliances. In an embodiment, the current steering DAC is implemented in a video circuit. The current steering DAC may be a standalone Integrated Circuit (IC) device or it may be integrated with other circuits in an IC device. In an embodiment, the current steering DAC is implemented with transistors, such as n-channel/n-type metal oxide semiconductor field-effect transistor (MOSFET) (NMOS) transistors and/or p-channel/p-type MOSFET (PMOS) transistors.

In the embodiment depicted in FIG. 1, the current steering DAC 100 includes three DAC unit cells 150-1, 150-2, 150-3 that are connected in parallel with each other. Each DAC unit cell 150-1, 150-2, or 150-3 includes two positive output terminals or pins, "ioutpA" and "ioutpB," and a negative output terminal or pin, "ioutn." The positive output terminals, "ioutpA," of the DAC unit cells 150-1, 150-2, 150-3 are tied together and connected to a positive output terminal or pin, "ioutpA_DAC," of the current steering DAC. In addition, the positive output terminals, "ioutpB," of the DAC unit cells 150-1, 150-2, 150-3 are tied together and connected to a positive output terminal or pin, "ioutpB_DAC," of the current steering DAC. Furthermore, the negative output terminals "ioutn" of the DAC unit cells 150-1, 150-2, 150-3 are tied together and connected to a negative output terminal or pin, "ioutn_DAC," of the current steering DAC. If input data for a particular one of the DAC unit cells is at logical high and input data for the other two DAC unit cells is at logical low, current will flow through a positive output terminal "ioutpA" or "ioutpB" of the particular one DAC unit cell and currents will flow through the negative output terminals "ioutn" of the other two DAC unit cells whose input data is at logical low. Although the current steering DAC is depicted and described with certain components and functionality, other embodiments of the current steering DAC may include fewer or more components to implement less or more functionality. In an embodiment, the current steering DAC may include more than three DAC unit cells 150 or less than three DAC unit cells. For example, a 10-bit current steering DAC may have 1024 (i.e., $2^{10}$) DAC unit cells if all unit cells are thermometer coded. The 1024 DAC unit cells are connected in parallel and connected to a data bus with a width of 1024. Each of the 1024 DAC unit cells includes two positive output terminals or pins, "ioutpA" and "ioutpB," and a negative output terminal or pin, "ioutn." The positive output terminals, "ioutpA," of the 1024 DAC unit cells are tied together and connected to the positive output terminal, "ioutpA_DAC," of the current steering DAC, the positive output terminals, "ioutpB," of the 1024 DAC unit cells are tied together and connected to the positive output terminal, "ioutpB_DAC," of the current steering DAC, and the negative output terminals, "ioutn," of the 1024 DAC unit cells are tied together and connected to the negative output terminal, "ioutn_DAC," of the current steering DAC. If input data for a particular one of the DAC unit cell is at logical high and input data for the rest of the DAC unit cells is at logical low, current will flow through a positive output terminal "ioutpA" or "ioutpB" of the particular one DAC unit cell and currents will flow through the negative output terminals "ioutn" of the other 1023 DAC unit cells whose input data is at logical low. The output terminals, "ioutpA," "ioutpB," and "ioutn," of each DAC unit cell 150 are connected to resistors that are connected to a voltage reference such as ground. In an embodiment, the terminal "ioutn_DAC" is connected to a voltage reference such as ground and at least one of the output terminals "ioutpA_DAC" and "ioutpB_DAC" of the current steering DAC is connected to a resistor that is connected to a voltage reference such as ground. For example, the output terminal "ioutpA_DAC" of the current steering DAC is connected to a first resistor, the output terminal "ioutn_DAC" of the current steering DAC is connected to a second resistor, and the output terminal "ioutpB_DAC" of the current steering DAC is connected to a third resistor. In this example, the first, second, and third resistors are connected to a voltage reference such as ground.

Figure 2:
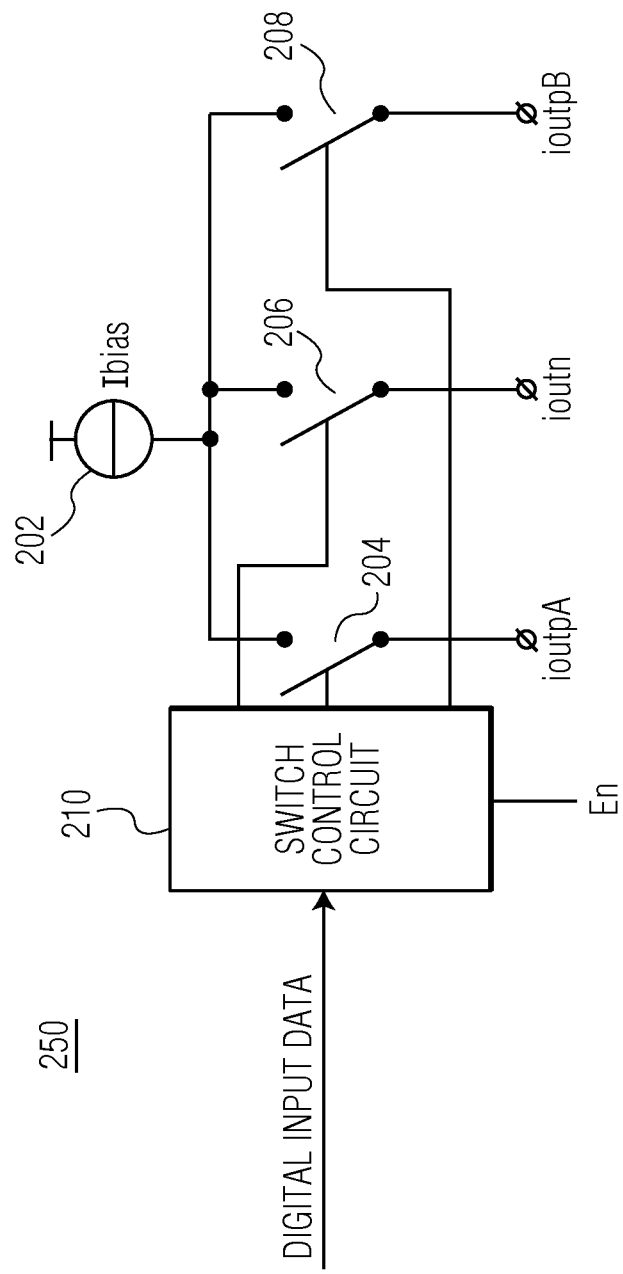
FIG. 2 is a schematic block diagram of a DAC unit cell of the current steering DAC depicted in FIG. 1.

FIG. 2 is a schematic block diagram of a DAC unit cell 150 of the current steering DAC 100 depicted in FIG. 1. In the embodiment depicted in FIG. 2, a DAC unit cell 250 includes a current source 202, a first output switch 204, a second output switch 206, a third output switch 208, and a switch control circuit 210. The DAC unit cell 250 is one of the possible implementations of the DAC unit cell 150 depicted in FIG. 1. In an embodiment, the current source 202 and the DAC unit cell 250 are located in different parts of the current steering DAC 100. For example, the current source 202 and the DAC unit cell 250 are located in separate substrate areas of an IC device. In an embodiment, the switch control circuit 210 and the DAC unit cell 250 are located in different parts of the current steering DAC 100. For example, the switch control circuit 210 and the DAC unit cell 250 are located in separate substrate areas of an IC device. Each DAC unit cell 250 may include conductive paths such as wires connected to the switch control circuit 210. The DAC unit cell 250 can be implemented using transistors. In an embodiment, at least one of the current source 202, the output switches 204, 206, 208 and the switch control circuit 210 is implemented with one or more NMOS transistors and/or PMOS transistors.

The current source 202 of the DAC unit cell 250 outputs a current, "$I_{bias}$." The output switches 204, 206, 208 of the DAC unit cell 250 form two differential pairs of switches that are placed in parallel with each other and share the negative (with respect to input data) output switch 206. Each differential switch pair directs a current to either a positive output terminal or a shared negative output terminal. In the embodiment depicted in FIG. 2, the first output switch 204 and the second output switch 206 form a first differential pair of switches while the third output switch 208 and the second output switch 206 form a second differential pair of switches. The first differential pair of switches is placed in parallel with the second differential pair of switches and shares the negative (with respect to input data) output switch 206 with the second differential pair of switches. The first differential pair of switches directs a current from the current source 202 to either a positive output terminal or pin, "ioutpA," or a negative output terminal or pin, "ioutn." The second differential pair of switches directs a current from the current source 202 to either a positive output terminal or pin, "ioutpB," or the negative output terminal or pin, "ioutn."

The switch control circuit 210 of the DAC unit cell 250 receives digital input data and controls the first and second differential pairs of switches formed by the first, second, and third output switches 204, 206, 208 to generate analog output data based on the digital input data and a current from the current source 202.

In the embodiment depicted in FIG. 2, output signals from the output terminals, "ioutpA" and "ioutn," form a first differential output signal, while output signals from the output terminals, "ioutpB" and "ioutn," form a second differential output signal. The switch control circuit 210 is configured to output the first differential output signal or the second differential output signal based on a output selection signal, "en." Although the DAC unit cell 250 is depicted and described with certain components and functionality, other embodiments of the DAC unit cell 250 may include fewer or more components to implement less or more functionality. In an embodiment, the DAC unit cell 250 may include more than three output switches, more than three output terminals, multiple switch control circuits, and/or multiple current sources. For example, the DAC unit cell 250 may include more than three output switches, which form at least three differential pairs of switches that are placed in parallel with each other and share the negative (with respect to input data) output switch of the output switches. In this case, one of the output switches is connected to a negative output terminal and the rest of the output switches are connected to positive output terminals. The output signal from each of the positive terminals and the output signal from the negative form a respective differential output signal. The switch control circuit 210 is configured to output one of the differential output signals based on the output selection signal, "en".

Compared with a conventional current steering DAC, the current steering DAC 100 does not require an external switch to redirect the output signal to multiple output destinations. Instead, each DAC unit cell 150 of the current steering DAC includes two differential pairs of output switches that are placed in parallel with each other and share the negative (with respect to input data) output switch of the output switches. In this way, two positive (with respect to the input data) output paths for a current are created. Because the current steering DAC can eliminate the need for an external switch, overall circuit area, such as printed circuit board (PCB) area, is saved and DAC design requirements are relaxed (i.e., not as restrictive as in a conventional current steering DAC).

Figure 3:
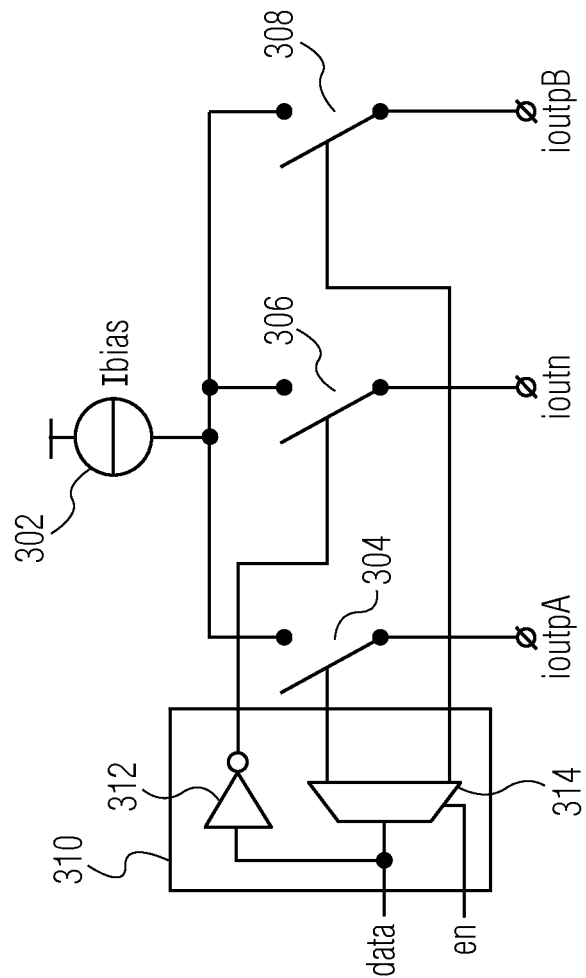
FIG. 3 depicts an embodiment of the DAC unit cell depicted in FIG. 2.

FIG. 3 depicts an embodiment of the DAC unit cell 250 depicted in FIG. 2, in which a switch control circuit 310 includes an inverter 312 and a switch 314. In the embodiment depicted in FIG. 3, a DAC unit cell 350 includes a current source 302, a first output switch 304, a second output switch 306, a third output switch 308, and a switch control circuit 310.

In the embodiment depicted in FIG. 3, the current source 302 and the output switches 304, 306, 308 perform similar or the same functions as the current source 202 and the output switches 204, 206, 208 depicted in FIG. 2. Specifically, the first output switch 304 and the second output switch 306 form a first differential pair of switches while the third output switch 308 and the second output switch 306 form a second differential pair of switches. The first differential pair of switches is placed in parallel with the second differential pair of switches and shares the negative (with respect to input data) output switch 306 with the second differential pair of switches. The first differential pair of switches directs a current from the current source 302 to either a positive output terminal, "ioutpA," or a negative output terminal, "ioutn." The second differential pair of switches directs a current from the current source to either a positive output terminal, "ioutpB," or the negative output terminal, "ioutn."

The inverter 312 of the switch control circuit 310 is configured to receive digital input data, "data," invert the digital input data, "data," and apply inverted digital input data to the second output switch 306. The switch 314 of the switch control circuit 310 is configured to receive the digital input data, "data," and an output selection signal, "en," and to apply the digital input data, "data," to either the first output switch 304 or the third output switch 308 based on a logical level of the output selection signal, "en." In the embodiment depicted in FIG. 3, output signals from the terminals, "ioutpA" and "ioutn," form a first differential output signal, while output signals from the terminals, "ioutpB" and "ioutn," form a second differential output signal. Depending on the output selection signal, "en," one of the first and second differential output signals is outputted from the DAC unit cell 350. Specifically, the output signal of the inverter 312 controls the second output switch 306 and output signals of the switch 314 control the first and third output switches 304, 308. The inverter 312 and the switch 314 are configured to control the first differential output signal and the second differential output signal based on the output selection signal, "en." In the embodiment depicted in FIG. 3, if the output selection signal, "en," is set to logical low, the switch 314 is configured to apply the digital input data, "data," to only the first output switch 304, and the first differential output signal is outputted from the DAC unit cell 350 via the terminals, "ioutpA" and "ioutn." If the output selection signal, "en," is set to logical high, the switch 314 is configured to apply the digital input data, "data," to only the third output switch 308, and the second differential output signal is outputted from the DAC unit cell 350 via the terminals, "ioutpB" and "ioutn."

Some examples of the operations of the DAC unit cell 350 are described as follows. In the following examples of the operations of the DAC unit cell 350, the digital input data, "data," and the output selection signal, "en," are initially at logical low. The inverter 312 inverts the digital input data, "data," and applies the inverted input data to the second output switch 306. The second output switch 306 is on (i.e., conducting). The conducting of the second output switch 306 makes it possible for a current to flow from the current source 302 through the corresponding output terminal, "ioutn.". Because the output selection signal, "en," is at logical low, the switch 314 applies the digital input data, "data," to the first output switch 304. Because digital input data, "data," is at logical low, the first output switch 304 is off (i.e., not conducting), which does not allow current to flow from the current source 302 through the corresponding output terminal, "ioutpA." Because the output selection signal, "en," is at logical low, the switch 314 does not apply a data signal to the third output switch 308. As a result, the third output switch 308 is off (i.e., not conducting), which does not allow current to flow from the current source 302 through the corresponding output terminal, "ioutpB."

Subsequently, digital input data, "data," changes from logical low to logical high and the output selection signal, "en," stays at logical low. The second output switch 306 is now off (i.e., not conducting). Because the output selection signal, "en," is at logical low, the switch 314 applies the digital input data, "data," to the first output switch 304. Because digital input data, "data," changes to logical high, the first output switch 304 is on (i.e., conducting). The conducting of the first output switch 304 makes it possible for a current to flow from the current source 302 through the corresponding output terminal, "ioutpA.". Because the output selection signal, "en," stays at logical low, the third output switch 308 is still off.

Subsequently, digital input data, "data," changes from logical high to logical low and the output selection signal, "en," stays at logical low. The second output switch 306 is now on (i.e., conducting). The conducting of the second output switch 306 makes it possible for a current to flow from the current source 302 through the corresponding output terminal, "ioutn." Because the output selection signal, "en," stays at logical low, the switch 314 applies the digital input data, "data," to the first output switch 304. Because digital input data, "data," is at logical low, the first output switch 304 is off (i.e., not conducting). Because the output selection signal, "en," is at logical low, the third output switch 308 is still off.

Subsequently, digital input data, "data," stays at logical low and the output selection signal, "en," changes from logical low to logical high. Because digital input data, "data," stays at logical low, the logical state of the output signal at the output terminal, "ioutn," stays at logical high. Because the output selection signal, "en," changes to logical high, the switch 314 applies the digital input data, "data," to the third output switch 308. Because digital input data, "data," is at logical low, the third output switch 308 is off (i.e., not conducting). Because the output selection signal, "en," changes to logical high, the switch 314 does not apply a data signal to the first output switch 304. As a result, the first output switch 304 is off (i.e., not conducting).

Subsequently, digital input data, "data," changes from logical low to logical high and the output selection signal, "en," stays at logical high. The second output switch 306 is now off (i.e., not conducting). Because the output selection signal, "en," stays at logical high, the switch 314 applies the digital input data, "data," to the third output switch 308. Because digital input data, "data," changes to logical high, the third output switch 308 is on (i.e., conducting). Because the output selection signal, "en," stays at logical high, the switch 314 does not apply a data signal to the first output switch 304.

Subsequently, digital input data, "data," changes from logical high to logical low and the output selection signal, "en," stays at logical high. The second output switch 306 is now on (i.e., conducting). Because the output selection signal, "en," stays at logical high, the switch 314 applies the digital input data, "data," to the third output switch 308. Because digital input data, "data," changes to logical low, the third output switch 308 is off (i.e., not conducting). Because the output selection signal, "en," stays at logical high, the switch 314 does not apply a data signal to the first output switch 304.

Figure 4:
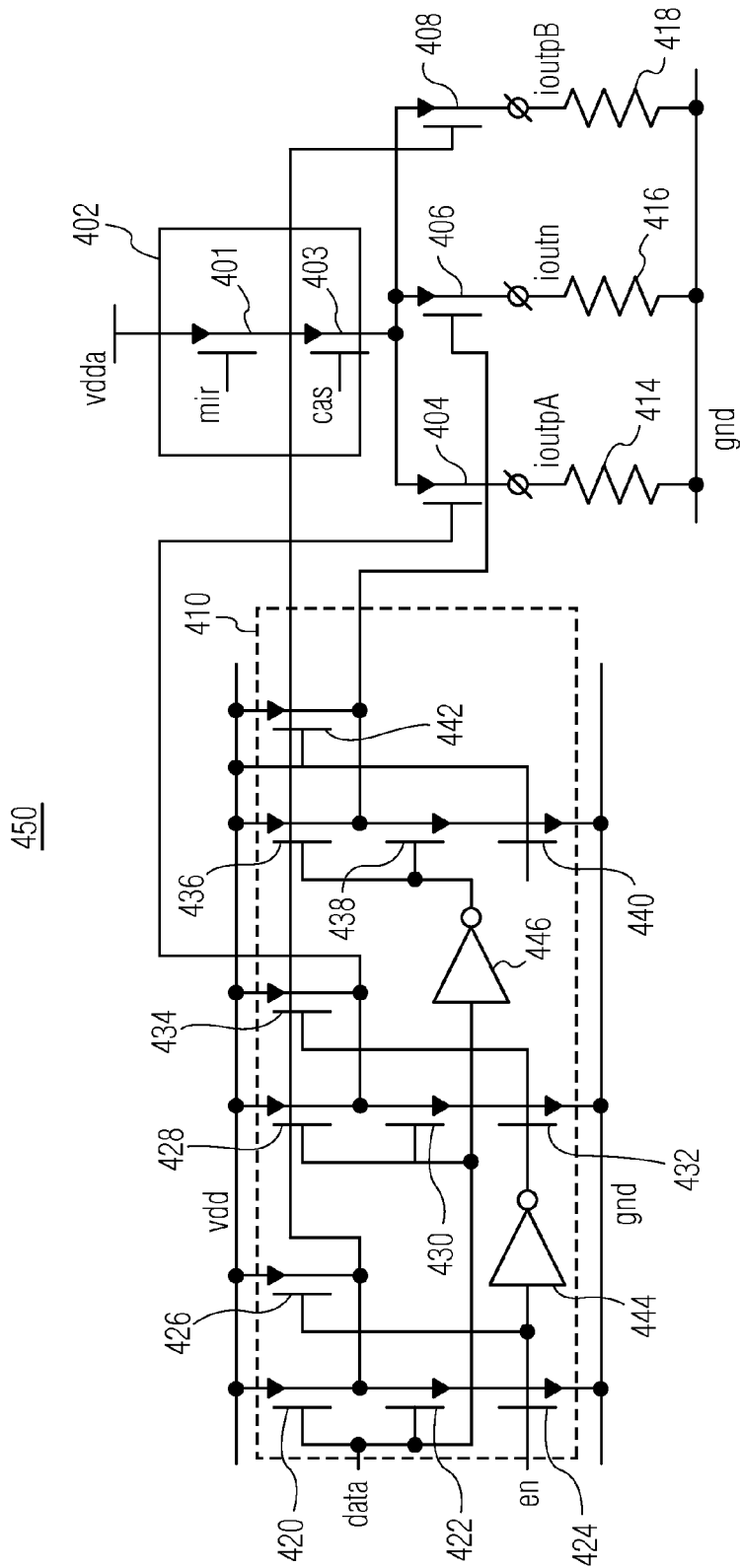
FIG. 4 depicts another embodiment of the DAC unit cell depicted in FIG. 2 in which output switches, a current source and a switch control circuit are implemented with transistors.

FIG. 4 depicts an embodiment of the DAC unit cell 250 in which output switches 404, 406, 408, a current source 402, and a switch control circuit 410 are implemented with transistors. In the DAC unit cell 450, the output switches 404, 406, 408 include the first PMOS switch 404, the second PMOS switch 406, and the third PMOS switch 408. In order to create a path for the current from the current source 402 to flow, the output terminals "ioutpA", "ioutn," and "ioutpB" of the DAC unit cell 450 are loaded with resistors 414, 416 and 418. These load resistors 414, 416 and 418 are not part of the DAC unit cell 450. However, the load resistors 414, 416 and 418 are connected to the output terminals "ioutpA_DAC", "ioutn_DAC" and "ioutpB_DAC" of the current steering DAC 100.

In the embodiment depicted in FIG. 4, the current source 402 of the DAC unit cell 450 includes a current source transistor 401 with a constant biasing voltage "mir" applied at its gate and a cascode transistor 403 with a constant biasing voltage "cas" applied at its gate. In some embodiments, the current source 402 may be implemented without the cascode transistor 403. As shown in FIG. 4, the current source 402 is connected to a voltage source, "vdda." In an embodiment, the voltage source, "vdda," is an interface, such as a conductive path (e.g., a wire) connected to a fixed voltage. In an embodiment, the voltage source, "vdda," may be a plugged-in power supply or a battery. In the embodiment depicted in FIG. 4, the current source 402 and the output switches 404, 406, 408 are implemented in PMOS transistors. The output voltages at the output terminals "ioutpA", "ioutn" and "ioutpB" are referenced to ground (gnd) over the resistors 414, 416 and 418. In some embodiments, the current source 402 and the output switches 404, 406, 408 may be implemented in NMOS transistors. In these embodiments, the circuit is "vertically mirrored." Specifically, the resistors 414, 416 and 418 are connected to the voltage supply "vdda." The NMOS output switches, the NMOS cascode, and the NMOS current source transistor are connected in sequence below the load resistors. The current source 402 and the PMOS switches 404, 406, 408 perform similar or the same functions as the current source 202 and the output switches 204, 206, 208 depicted in FIG. 2. Specifically, the first PMOS switch and the second PMOS switch form a first differential pair of switches while the third PMOS switch and the second PMOS switch form a second differential pair of switches. The first differential pair of switches is placed in parallel with the second differential pair of switches and shares the negative (with respect to input data) output switch 406 with the second differential pair of switches. The first differential pair of switches directs a current from the current source 402 to either a positive output terminal, "ioutpA" or a negative output terminal, "ioutn." The second differential pair of switches directs a current from the current source 402 to either a positive output terminal, "ioutpB," or the negative output terminal, "ioutn." In the embodiment depicted in FIG. 4, the output terminals "ioutpA," "ioutn," "ioutpB," are connected to the ground (gnd) via resistors 414, 416, 418, respectively.

Digital input data, "data," controls the gates of the first PMOS switch 404 and the third PMOS switch 408 depending on an output selection signal, "en." The gate of the second PMOS switch 406 is also controlled by the digital input data, "data." In the embodiment depicted in FIG. 4, output signals from the terminals, "ioutpA" and "ioutn," form a first differential output signal, while output signals from the terminals, "ioutpB" and "ioutn," form a second differential output signal. The switch control circuit 410 is configured to control the first differential output signal and the second differential output signal based on the output selection signal, "en." Specifically, as shown in FIG. 4, the switch control circuit 410 is connected to voltages "vdd" and the ground (gnd). The switch control circuit 410 includes transistors 420, 422, 424, 426, 428, 430, 432, 434, 436, 438, 440, 442 and inverters 444, 446.

The switch control circuit 410 performs the same function as the switch control circuit 310. However, because the output switches 404, 406, 408 are implemented with PMOS transistors, the input data must be inverted in comparison with the switch control circuit 310. In this embodiment, the circuits in front of the PMOS output switches 404, 406, 408 are identical to each other to keep the parasitic capacitance on the gates of the PMOS output switches 404, 406, 408 equal. The switch control circuit 410 includes three identical two-input NAND gate circuits. The first NAND gate is formed by transistors 420, 422, 424 and 426. The second NAND gate is formed by transistors 428, 430, 432 and 434. The third NAND gate is formed by transistors 436, 438, 440 and 442. Digital input data, "data," is connected to the inverter 446 after that digital input data, "data," is again inverted by the third NAND gate. The gates of the NMOS transistor 440 and the PMOS transistor 442 are connected to the supply voltage "vdd." As a result, the transistor 440 is conducting and the transistor 442 is off, which means that third NAND gate always behaves as an inverter. Therefore, the data input to the PMOS transistor 406 is inverted twice. If digital input data, "data," is at logical low, the signal applied to the gate of the PMOS transistor 406 is logical low and the PMOS transistor 406 is on (i.e., conducting). If digital input data, "data," is at logical high, the signal applied to the gate of the PMOS transistor 406 is at logical high and the PMOS transistor 406 is off (i.e., not conducting). Digital input data, "data," is also connected to the first NAND gate. The gates of the NMOS transistor 424 and the PMOS transistor 426 are connected to the output selection signal, "en." Therefore, if the output selection signal, "en," is at logical low, the transistor 424 is switched off and the transistor 426 is conducting. Thus, if the output selection signal, "en," is at logical low, the output of the first NAND gate will always be logical high. As a result, the input signal applied to the gate of the PMOS transistor 408 is at logical high and the PMOS transistor 408 is switched off (i.e., not conducting). Digital input data, "data," is also connected to the second NAND gate. The output selection signal, "en," is inverted by the inverter 444, which is connected to the gates of the NMOS transistor 432 and the PMOS transistor 434. Therefore, if the output selection signal, "en," is at logical low, signals applied to the gates of the transistors 432 and 434 are at logical high, which means that the transistor 432 is conducting and the transistor 434 is switched off. Thus, if the output selection signal, "en," is at logical low, the second NAND gate works as a normal inverter. In this case, if digital input data, "data," is at logical low, the signal applied to the gate of the PMOS transistor 404 will be logical high and the PMOS transistor 404 will be switched off.

Figure 5:
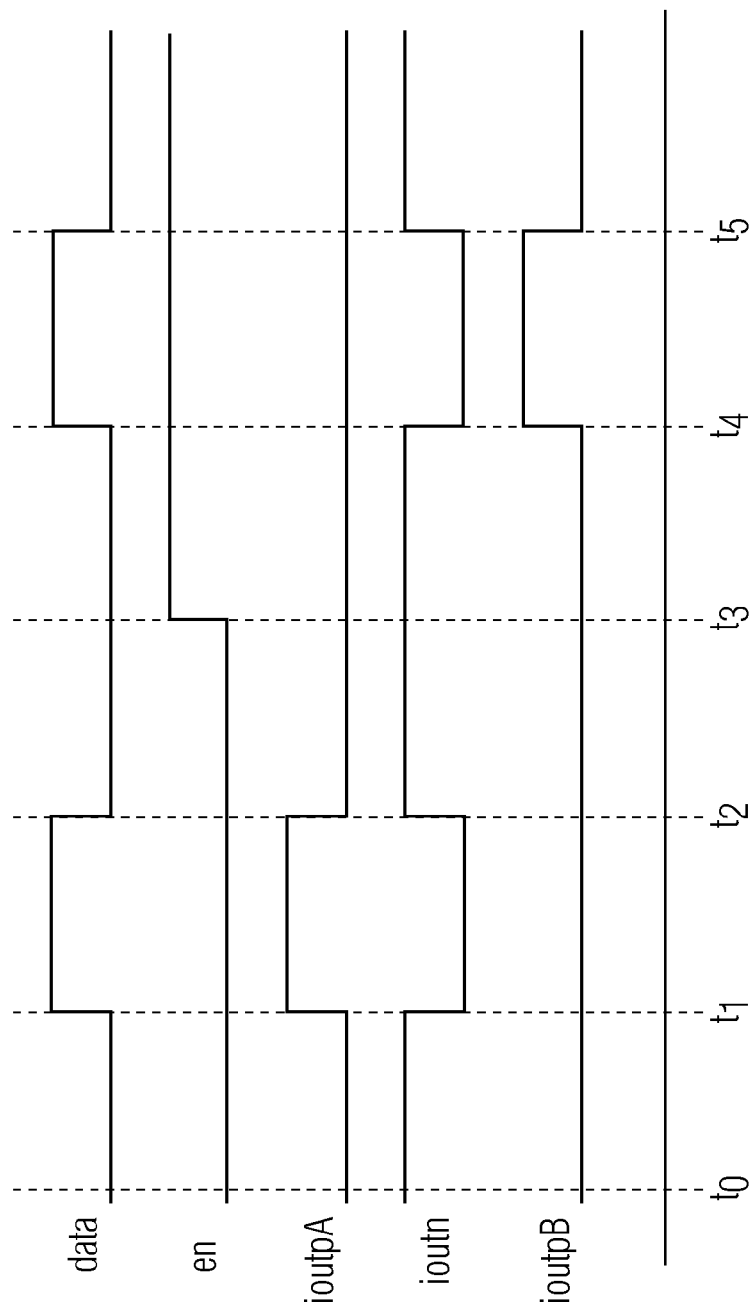
FIG. 5 is a timing diagram of an operation of the DAC unit cell depicted in FIG. 4.

FIG. 5 is a timing diagram of an operation of the DAC unit cell 450 depicted in FIG. 4. Specifically, the logical states of digital input data, "data," the output selection signal, "en," and the output voltages at the output terminals, "ioutpA," "ioutn," and "ioutpB" are shown in FIG. 4. At time $t_o$, digital input data, "data," and the output selection signal, "en," are at logical low. The second PMOS switch 406 is switched on (i.e., conducting) and the conducting of the second PMOS switch 406 causes a current to flow through the corresponding output terminal, "ioutn," which causes the output voltage at the output terminal, "ioutn," and the corresponding resistor 416, to increase to a higher value. Because the output selection signal, "en," is at logical low and digital input data, "data," is at logical low, the first PMOS switch 404 is off (i.e., not conducting) and the output voltage at the corresponding output terminal, "ioutpA," is at a lower value (e.g., zero volt). Because the output selection signal, "en," is at logical low, the third PMOS switch 408 is off (i.e., not conducting) and the output voltage at the corresponding output terminal, "ioutpB," is at a lower value (e.g. zero volt).

At time $t_1$, digital input data, "data," changes from logical low to logical high and the output selection signal, "en," stays at logical low. The second PMOS switch 406 is now off (i.e., not conducting), and the output voltage at the corresponding output terminal, "ioutn," decreases to a lower value (e.g. zero volt). Because the output selection signal, "en," is at logical low and digital input data, "data," changes to logical high, the first PMOS switch 404 is on (i.e., conducting). The conducting of the first PMOS switch 404 causes a current to flow through the corresponding output terminal, "ioutpA," and the corresponding resistor 414, which causes the output voltage at the output terminal, "ioutpA," to increase to a higher value. Because the output selection signal, "en," stays at logical low, the output voltage at the output terminal, "ioutpB," stays low.

At time $t_2$, digital input data, "data," changes from logical high to logical low and the output selection signal, "en," stays at logical low. The second PMOS switch 406 is now on (i.e., conducting). The conductive state of the second PMOS switch 406 causes a current to flow through the corresponding output terminal, "ioutn," and the corresponding resistor 416, which causes the output voltage at the output terminal, "ioutn," to increase. Because the output selection signal, "en," stays at logical low and digital input data, "data," is at logical low, the first PMOS switch 404 is off (i.e., not conducting) and the output voltage at the corresponding output terminal, "ioutpA," decreases. Because the output selection signal, "en," is at logical low, the output voltage at the output terminal, "ioutpB," stays low.

At time $t_3$, digital input data, "data," stays at logical low and the output selection signal, "en," changes from logical low to logical high. Because digital input data, "data," stays at logical low, the output voltage at the output terminal, "ioutn," stays high. Because the output selection signal, "en," changes to logical high and digital input data, "data," is at logical low, the third PMOS switch 408 is off (i.e., not conducting) and the output voltage at the corresponding output terminal, "ioutpB," stays low. Because the output selection signal, "en," changes to logical high, the first PMOS switch 404 is off (i.e., not conducting) and the output voltage at the corresponding output terminal, "ioutpA," stays low.

At time $t_4$, digital input data, "data," changes from logical low to logical high and the output selection signal, "en," stays at logical high. The second PMOS switch 406 is now off (i.e., not conducting) and the output voltage at the corresponding output terminal, "ioutn," decreases. Because the output selection signal, "en," stays at logical high and digital input data, "data," changes to logical high, the third PMOS switch 408 is on (i.e., conducting). The conductive state of the third PMOS switch 408 causes a current to flow through the corresponding output terminal, "ioutpB," and the corresponding resistor 418, which causes the output voltage at the output terminal, "ioutpB," to increase. Because the output selection signal, "en," stays at logical high, the output voltage at the corresponding output terminal, "ioutpA," stays low.

At time $t_5$, digital input data, "data," changes from logical high to logical low and the output selection signal, "en," stays at logical high. The second PMOS switch 406 is now on (i.e., conducting). The conductive state of the second PMOS switch 406 causes a current to flow through the corresponding output terminal, "ioutn," and the corresponding resistor 416, which causes the output voltage at the output terminal, "ioutn," to increase. Because the output selection signal, "en," stays at logical high and digital input data, "data," changes to logical low, the third PMOS switch 408 is off (i.e., not conducting) and the output voltage at the corresponding output terminal, "ioutpB," decreases. Because the output selection signal, "en," stays at logical high, the output voltage at the corresponding output terminal, "ioutpA," stays low.

In some embodiments, the current steering DAC 100 is used in video applications. For example, the current steering DAC depicted in FIG. 1 can be included in a video circuit such as a video adapter circuit, a video level shifter circuit, or a video multiplexer circuit. The current steering DAC depicted in FIG. 1 may be used to convert digital video data into analog video data and direct analog video data to multiple output destinations, without an external switch that is often required with a conventional current steering DAC.

Figure 6:
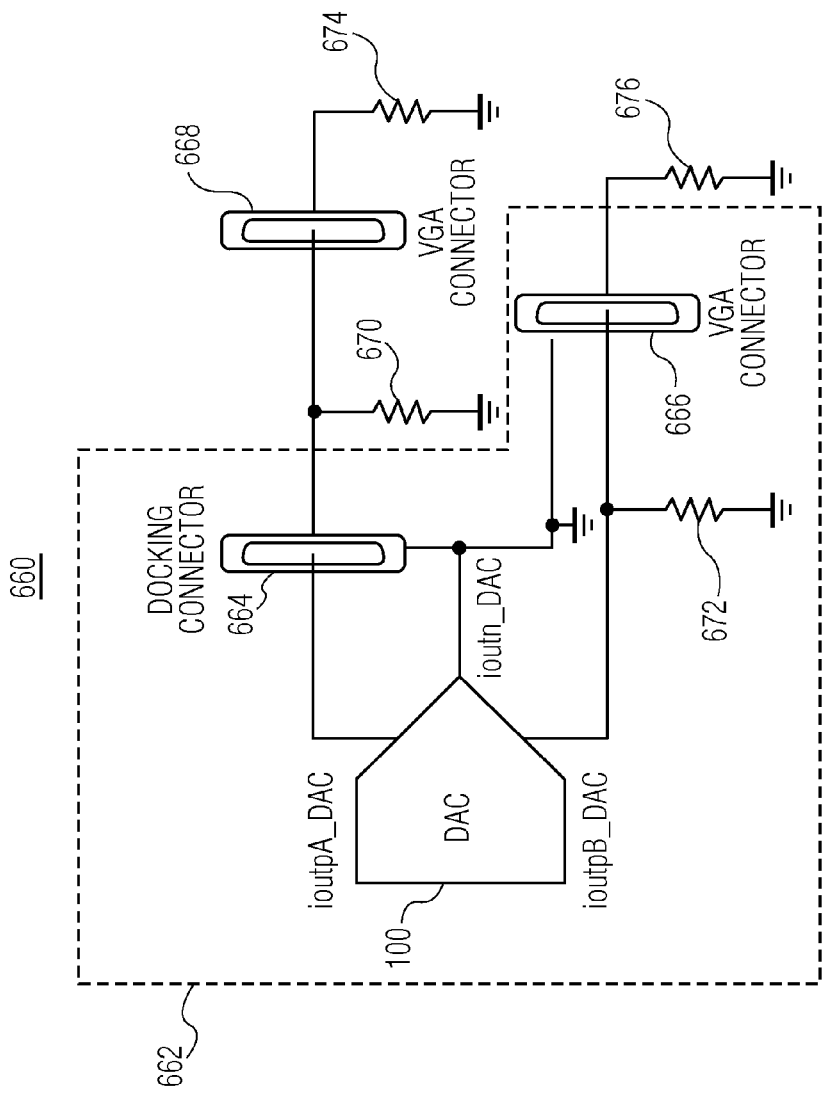
FIG. 6 depicts a video circuit that includes the current steering DAC depicted in FIG. 1.

FIG. 6 depicts a video circuit 660 that includes the current steering DAC 100 depicted in FIG. 1. In the embodiment depicted in FIG. 6, the video circuit 660 includes the current steering DAC 100, a docking connector 664, two VGA connectors 666, 668, and resistors 670, 672, 674, 676. A motherboard 662 hosts the current steering DAC 100, the docking connector 664, the resistor 672, and the VGA connector 666. The resistor 670 and the VGA connector 668 are located in a docking station. Each of the resistors 674 and 676 represents the impedance of a connected display device. In the embodiment depicted in FIG. 6, the resistors 670, 672, 674, 676 have resistance values of 75 ohm (a). However, in some embodiments, the resistance values of the resistors 670, 672, 674, 676 are other values. The docking connector and the VGA connector 668 receive one differential signal from the current steering DAC, i.e., from the output terminals "ioutpA_DAC" and "ioutn_DAC," and the VGA connector 666 receives another differential signal from the current steering DAC, i.e., from the output terminals "ioutpB_DAC" and "ioutn_DAC." The differential signals received at the VGA connectors 666, 668 can be displayed on display devices. In the embodiment depicted in FIG. 6, the VGA connectors 666, 668 are connected to different display devices (represented by the resistors 674 and 676). Examples of display devices include, without limitation, computer monitors such as Cathode ray tube (CRT) monitors, Liquid Crystal (LCD) monitors, and light-emitting diode (LED) monitors, Television (TV) sets, and projectors. Although the video circuit 660 is depicted and described with certain components and functionality, other embodiments of the video adapter may include fewer or more components to implement less or more functionality. For example, the video circuit 660 may include multiple current steering DACs, more than two VGA connectors, two or more other video connectors, and no docking connector or multiple docking connectors.

Figure 7:
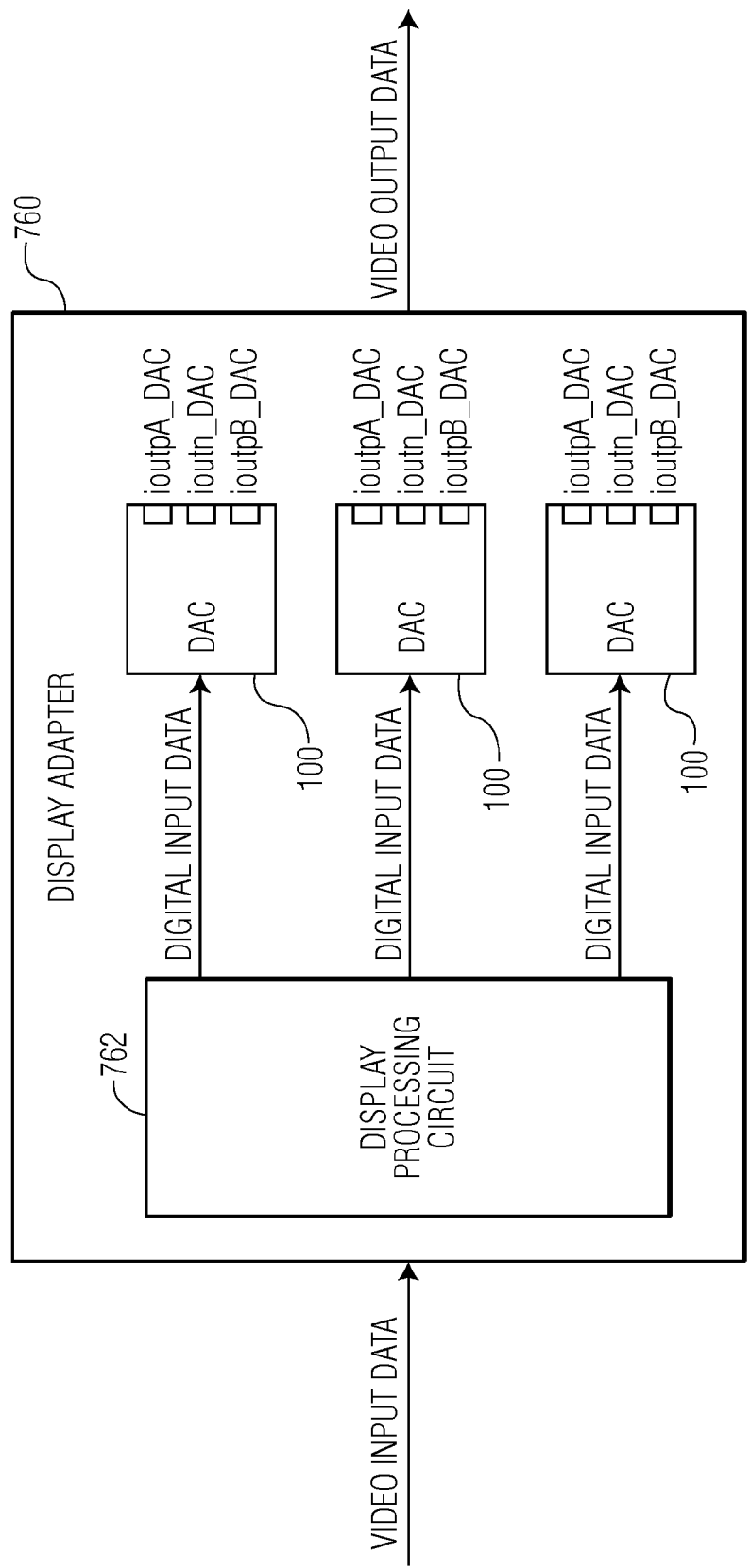
FIG. 7 depicts a display adapter that includes the current steering DAC depicted in FIG. 1.

FIG. 7 depicts a video adapter 760 that includes the current steering DAC 100 depicted in FIG. 1. The video adapter processes digital video input data to generate analog video output data. The video input data and the video output data may be in accordance with the same video standard or in accordance with different video standards. In an embodiment, the video input data is digital data that is in accordance with DisplayPort video standard developed by the Video Electronics Standards Association (VESA), Digital Visual Interface (DVI) video interface standard, or High-Definition Multimedia Interface (HDMI) video interface standard, while the video output data is analog data that is in accordance with VGA. In the embodiment depicted in FIG. 7, the video adapter includes a video processing circuit 762 and three current steering DACs 100. The video processing circuit is configured to generate digital input data based on the video input data. The current steering DACs 100 are configured to convert the digital input data into analog data and output differential analog signals through the output terminals "ioupA_DAC" and "ioutn_DAC" or through the output terminals "ioupB_DAC" and "ioutn_DAC." In an embodiment, the current steering DACs generate analog data that represents red, green, and blue color data in a RGB color model. Although the video adapter 760 is depicted and described with certain components and functionality, other embodiments of the video adapter may include fewer or more components to implement less or more functionality. For example, the video adapter may include less than three current steering DACs or more than three current steering DACs.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A current steering Digital-to-Analog Converter (DAC) comprising:
   a plurality of DAC unit cells that are connected in parallel with each other, wherein each of the DAC unit cells comprises:
      a first output switch connected to a current source and a first output terminal;
      a second output switch connected to the current source and a second output terminal; and
      a third output switch connected to the current source and a third output terminal,
   wherein the current steering DAC further comprises a switch control circuit configured to receive digital input data and to control the first, second, and third output switches of each of the DAC unit cells to generate differential analog output data based on the digital input data and a current from the current source,
   wherein in each of the DAC unit cells, the first, second, and third output switches are configured to form two differential pairs of switches that are placed in parallel with each other and share a negative output switch with respect to the digital input data.

2. The current steering DAC of claim 1, wherein the first output terminals of the DAC unit cells are tied together and connected to a first output terminal of the current steering DAC, the second output terminals of the DAC unit cells are tied together and connected to a second output terminal of the current steering DAC, and the third output terminals of the DAC unit cells are tied together and connected to a third output terminal of the current steering DAC.

3. The current steering DAC of claim 1, wherein in each of the DAC unit cells,
the first and second output switches are configured to form a first differential pair of switches,
the second and third output switch are configured to form a second differential pair of switches,
the first differential pair of switches is placed in parallel with the second differential pair of switches and shares the negative output switch with the second differential pair of switches,
output signals from the first and second output terminals form a first differential output signal,
output signals from the second and third output terminals form a second differential output signal, and
the switch control circuit is further configured to output the first differential output signal or the second differential output signal based on an output selection signal.

4. The current steering DAC of claim 3, wherein the switch control circuit comprises an inverter and a switch, wherein the inverter and the switch are configured to receive the digital input data, and wherein the switch is further configured to receive the output selection signal.

5. The current steering DAC of claim 4, wherein the inverter is further configured to invert the digital input data and apply inverted digital input data to the second output switch, and wherein the switch is further configured to apply the digital input data to either the first output switch or the third output switch based on a logical level of the output selection signal.

6. The current steering DAC of claim 5, wherein the switch is further configured to apply the digital input data to only the first output switch if the output selection signal is at logical low, and wherein the switch control circuit is further configured to output the first differential output signal.

7. The current steering DAC of claim 5, wherein the switch is further configured to apply the digital input data to only the third output switch if the output selection signal is at logical high, and wherein the switch control circuit is further configured to output the second differential output signal.

8. The current steering DAC of claim 3, wherein the switch control circuit comprises transistors and inverters.

9. The current steering DAC of claim 3, wherein each of the first, second, and third output switches comprises a PMOS or NMOS transistor.

10. The current steering DAC of claim 9, wherein the switch control circuit is connected to the gate terminals of the PMOS transistors of the first, second, and third output switches and is further configured to control the gate terminals of the PMOS transistors of the first, second, and third output switches to output the first differential output signal or the second differential output signal based on the digital input data and the output selection signal.

11. The current steering DAC of claim 3, wherein the first, second, and third output terminals are connected to ground through resistors.

12. The current steering DAC of claim 3, wherein each of the DAC unit cells includes a current source transistor and a cascode transistor.

13. A video adapter comprising:
a video processing circuit configured to generate digital input data based on video input data; and
a current steering Digital-to-Analog Converter (DAC) configured to convert the digital input data into analog data and output differential analog signals, wherein the current steering DAC includes a plurality of DAC unit cells that are connected in parallel with each other, wherein each of the DAC unit cells comprises:
a first output switch connected to a current source and a first output terminal;
a second output switch connected to the current source and a second output terminal; and
a third output switch connected to the current source and a third output terminal, wherein the first, second, and third output switches are configured to form two differential pairs of switches that are placed in parallel with each other and share a negative output switch with respect to the digital input data,
wherein the current steering DAC further comprises a switch control circuit configured to receive the digital input data and to control the first, second, and third output switches of each of the DAC unit cells to generate differential analog output data based on the digital input data and a current from the current source.

14. The video adapter of claim 13, wherein the first output terminals of the DAC unit cells are tied together and connected to a first output terminal of the current steering DAC, the second output terminals of the DAC unit cells are tied together and connected to a second output terminal of the current steering DAC, and the third output terminals of the DAC unit cells are tied together and connected to a third output terminal of the current steering DAC.

15. The video adapter of claim 13, wherein in each of the DAC unit cells,
the first and second output switches are configured to form a first differential pair of switches,
the second and third output switch are configured to form a second differential pair of switches,
the first differential pair of switches is placed in parallel with the second differential pair of switches and shares the negative output switch with the second differential pair of switches,
output signals from the first and second output terminals form a first differential output signal,
output signals from the second and third output terminals form a second differential output signal, and
the switch control circuit is further configured to output the first differential output signal or the second differential output signal based on an output selection signal.

16. The video adapter of claim 15, wherein the switch control circuit comprises an inverter and a switch, wherein the switch is configured to receive the digital input data and the output selection signal and to apply the digital input data to either the first output switch or the third output switch based on a logical level of the output selection signal, and wherein the inverter is configured to receive the digital input data, invert the digital input data, and apply inverted digital input data to the second output switch.

17. The video adapter of claim 16, wherein the switch is further configured to apply the digital input data to only the first output switch if the output selection signal is at logical low, and wherein the switch control circuit is further configured to output the first differential output signal.

18. The video adapter of claim 16, wherein the switch is further configured to apply the digital input data to only the third output switch if the output selection signal is at logical high, and wherein the switch control circuit is further configured to output the second differential output signal.

19. A video circuit comprising:

a plurality of Video Graphics Array (VGA) connectors; and a current steering Digital-to-Analog Converter (DAC) connected to the VGA connectors, the current steering DAC comprising:

a plurality of DAC unit cells that are connected in parallel with each other, wherein each of the DAC unit cells comprises:

a first output switch connected to a current source and a first output terminal;

a second output switch connected to the current source and a second output terminal; and a third output switch connected to the current source and a third output terminal, wherein the current steering DAC further comprises a switch control circuit configured to receive digital input data and to control the first, second, and third output switches of each of the DAC unit cells to generate differential analog output data based on the digital input data and a current from the current source, wherein, in each of the DAC unit cells, the first, second, and third output switches are configured to form two differential pairs of switches that are placed in parallel with each other and share a negative output switch with respect to the digital input data.

20. The video circuit of claim 19, wherein the first output terminals of the DAC unit cells are tied together and connected to a first output terminal of the current steering DAC, the second output terminals of the DAC unit cells are tied together and connected to a second output terminal of the current steering DAC, and the third output terminals of the DAC unit cells are tied together and connected to a third output terminal of the current steering DAC, wherein the video circuit does not include an external switch coupled between the current steering DAC and the VGA connectors.

* * * * *